United States Patent
Paulus

(10) Patent No.: US 6,969,905 B2
(45) Date of Patent: Nov. 29, 2005

(54) LEADFRAME FOR SEMICONDUCTOR CHIPS AND ELECTRONIC DEVICES AND PRODUCTION METHODS FOR A LEADFRAME AND FOR ELECTRONIC DEVICES

(75) Inventor: Stefan Paulus, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 10/330,440

(22) Filed: Dec. 27, 2002

(65) Prior Publication Data

US 2003/0102538 A1      Jun. 5, 2003

Related U.S. Application Data

(63) Continuation of application No. PCT/DE01/02097, filed on Jun. 7, 2001.

(30) Foreign Application Priority Data

Jun. 27, 2000  (DE) ................................. 100 31 204

(51) Int. Cl.[7] ............................................ H01L 23/495

(52) U.S. Cl. .................... 257/666; 257/676; 257/737; 257/778; 438/112; 438/123; 438/614

(58) Field of Search ................................. 257/737, 738, 257/741, 778, 780, 781, 666, 673, 676; 438/108, 438/111, 112, 123, 124, 613, 614

(56) References Cited

U.S. PATENT DOCUMENTS

| | | | |
|---|---|---|---|
| 4,890,152 A | * | 12/1989 | Hirata et al. ................. 257/666 |
| 5,567,656 A | | 10/1996 | Chun |
| 5,629,559 A | * | 5/1997 | Miyahara .................... 257/666 |
| 5,710,062 A | | 1/1998 | Sawai et al. |
| 5,767,580 A | * | 6/1998 | Rostoker .................... 257/737 |
| 6,025,640 A | | 2/2000 | Yagi et al. |
| 6,080,932 A | * | 6/2000 | Smith et al. ................ 174/52.4 |
| 6,240,632 B1 | * | 6/2001 | Ito et al. ....................... 29/827 |
| 6,856,017 B2 | * | 2/2005 | Yoneda et al. .............. 257/730 |

FOREIGN PATENT DOCUMENTS

| | | |
|---|---|---|
| JP | 54069068 A | 6/1979 |
| JP | 59208756 A | 11/1984 |
| JP | 01106456 A | 4/1989 |
| JP | 01179334 A | 7/1989 |
| JP | 02174233 A | 7/1990 |
| JP | 04170084 A | 6/1992 |
| JP | 07014843 A | 1/1995 |
| JP | 09082741 A | 3/1997 |
| JP | 11195733 A | 7/1999 |

* cited by examiner

*Primary Examiner*—Hoai Pham
*Assistant Examiner*—Ginette Peralta
(74) *Attorney, Agent, or Firm*—Laurence A. Greenberg; Werner H. Stemer; Ralph E. Locher

(57) ABSTRACT

A leadframe for semiconductor chips and electronic devices produced on the leadframe includes providing the leadframe with a basic substrate, on which are disposed external contact elements exhibiting a rivet-shaped cross-section with a rivet head region, a rivet shank region, and a rivet foot region, as a result of which, the external contact elements are securely anchored in the housing made of a plastics compound.

52 Claims, 5 Drawing Sheets

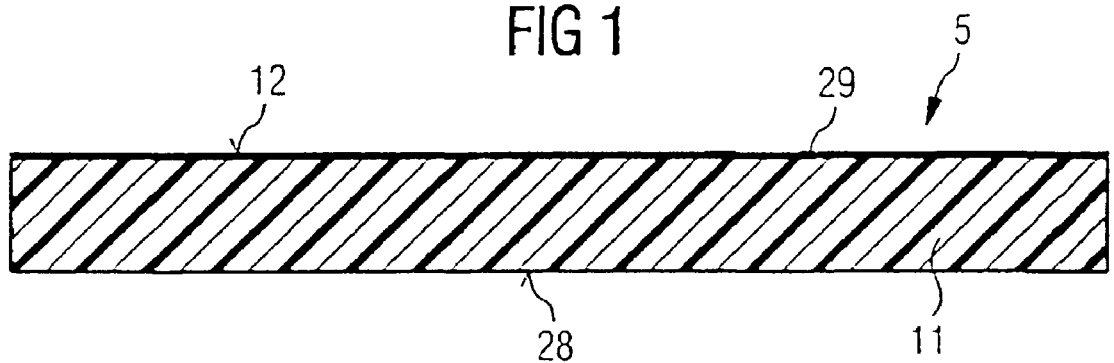
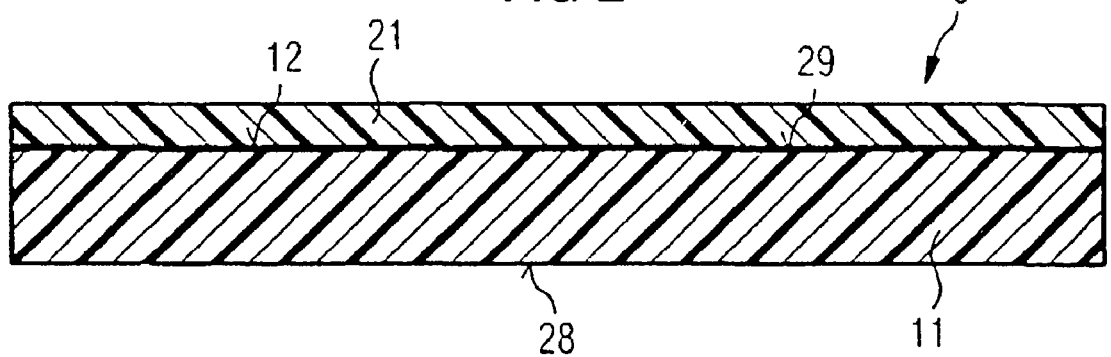
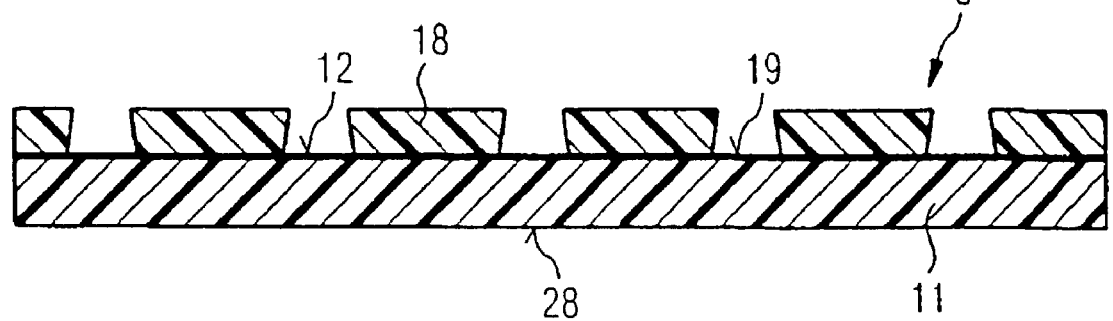

LEADFRAME FOR SEMICONDUCTOR CHIPS AND ELECTRONIC DEVICES AND PRODUCTION METHODS FOR A LEADFRAME AND FOR ELECTRONIC DEVICES

CROSS-REFERENCE TO RELATED APPLICATION

This application is a continuation of copending International Application No. PCT/DE01/02097, filed Jun. 7, 2001, which designated the United States and was not published in English.

BACKGROUND OF THE INVENTION

Field of the Invention

The invention relates to a leadframe for semiconductor chips and electronic devices and methods for producing them.

Leadframes for semiconductor chips for packing the semiconductor chips to form electronic devices in housings made of a plastics compound have to satisfy high reliability despite their mass production. This is true particularly if the leadframe is to be used to produce housings from which no flat conductors whatsoever protrude as terminal pins or terminal legs and, in the case of which, the housing made of plastics compound is intended to encapsulate the semiconductor chip and corresponding external contact elements only on one side so that the underside of the electronic device is formed, at least in the edge region, from external contact elements and plastics compound disposed in between. In such a case, there is the risk that, during the production or during the operation of the electronic device, the external contact elements will become detached from the plastics compound and the electronic device will, thus, become unusable.

SUMMARY OF THE INVENTION

It is accordingly an object of the invention to provide a leadframe for semiconductor chips and electronic devices and production methods for a leadframe and for electronic devices that overcome the hereinafore-mentioned disadvantages of the heretofore-known devices and methods of this general type and that has and have, respectively, external contact elements which maintain their position on the plastics compound during the production and service life of the electronic device.

With the foregoing and other objects in view, there is provided, in accordance with the invention, a leadframe for packaging semiconductor chips to form electronic devices in housings of a plastics compound, including a basic substrate and external contact elements having a rivet-shaped cross-section with a rivet head region, a rivet shank region, and a rivet foot region, the rivet foot region being fixed on the basic substrate. The basic substrate that holds the leadframe together during population with semiconductor chips.

In accordance with another feature of the invention, the basic substrate has an electrically conductive surface, which has the advantage that, for the construction of external contact elements on the basic substrate, it is possible to apply an electrical voltage to the electrically conductive surface.

In accordance with a further feature of the invention, such an electrically conductive surface is achieved by a basic substrate made of a metallic foil. However, in a further embodiment of the invention, the basic substrate may include a plastic film with a metallic coating. Such a film with a metallic coating has the advantage that it can be separated relatively easily, in further processing, from the electronic devices that are to be formed on the leadframe.

In accordance with an added feature of the invention, the plastic film has a carbon coating. As a result, its surface becomes electrically conductive. Such an embodiment has the advantage that such plastic films with a carbon coating both have a sufficiently electrically conductive surface by virtue of the carbon coating and increase the separation possibility for the basic substrate of the leadframe during the further processing of the semiconductor chips to form electronic devices.

In accordance with an additional feature of the invention, the leadframe has a plurality of component mounting regions on the basic substrate. Each component mounting region can be populated with a chip that can be positioned in a central chip carrier region of the mounting region. In terms of their plan, circular elongate or square external contact elements with a rivet-shaped cross-section can be grouped all around the chip carrier region at a defined distance from the central chip carrier region.

In accordance with yet another feature of the invention, external contact elements are disposed at least partly in the chip carrier region such that a semiconductor chip can be bonded by bonding bumps on the rivet head regions of the external contact elements using flip-chip technology. In the case of such a chip carrier embodiment, the bonding bumps of a semiconductor chip can be soldered or adhesively bonded directly onto the rivet head region of the external contact areas, the external contact elements being able to be excellently anchored in the plastics compound by virtue of the rivet-shaped cross-section. A further advantage of the cross-sectionally-rivet-shaped external contact elements on the leadframe according to the invention is that the external contact elements can be coordinated with the later use of the leadframe by different layering of metals and noble metals.

In accordance with yet a further feature of the invention, the external contact element on the leadframe is made of pure silver or a silver alloy. The material silver has the advantage that it does not form an oxide coating inhibiting the electrical conductivity, but, rather, a silver sulfite coating that is electrically conductive.

In accordance with yet an added feature of the invention, the external contact element on the leadframe is constructed from a gold/nickel/gold layer sequence. Such a layer sequence has the advantage that the gold does not form a resistance-increasing oxide layer and the nickel layer is completely enclosed by gold, thereby guaranteeing a long service life of the external contact elements. At the same time, an outer gold layer can serve as an etching stop during the singulation of a leadframe of devices.

In accordance with yet an additional feature of the invention, the external contact elements are constructed from a silver/copper/silver layer sequence. Such a layer sequence is less expensive and has an advantage over external contact elements made of a layer sequence of gold/nickel/gold through the use of materials with an extremely low electrical resistance.

In accordance with again another feature of the invention, each of the mounting regions respectively has a central chip carrier region surrounded by the external contact elements at a defined distance from the central chip carrier region.

In accordance with again a further feature of the invention, the external contact elements have a circular plan and are completely disposed in the chip carrier region.

In accordance with again an added feature of the invention, the leadframe has a metallic base in the chip carrier region, whose height (h) corresponds to the external contact elements and whose areal extent is adapted to the size of the semiconductor chip. The base may be constructed from the same material as the external contact elements so that it can be produced at the same time as the external contact elements. The base has the advantage, moreover, that it can be soldered or adhesively bonded to the underside of the semiconductor chip, which does not carry an active circuit, and may, thus, have an earth or ground contact for the entire electronic device toward the outside.

With the objects of the invention in view, there is also provided an electronic device, including a housing of a plastics compound and a leadframe for packaging semiconductor chips in the housing, the leadframe disposed in the housing and having a basic substrate and external contact elements having a rivet-shaped cross-section with a rivet head region, a rivet shank region, and a rivet foot region, the rivet foot region being fixed on the basic substrate. The leadframe is used for producing electronic devices. In such a case, the external contact elements can have a circular plan or else form elongate or square external contact elements.

With the objects of the invention in view, there is also provided a method for producing a leadframe for packaging semiconductor chips to form electronic devices in housings of a plastics compound, including the steps of providing a basic substrate with an electrically conductive surface, applying on the basic substrate a patterned electrically insulating layer having uncovered electrically conductive surface regions in a contact element configuration, applying a conductive material to form external contact elements in the contact element configuration, the external contact elements having a rivet-shaped cross-section with a rivet head region, a rivet shank region, and a rivet foot region, the rivet foot region being fixed on the basic substrate, and removing the patterned electrically insulating layer.

Such a method has the advantage that external contact elements are produced on the leadframe that have a rivet-shaped cross-section and are fixedly anchored in the plastics compound on account of such cross-section so that the leadframe ensures that the external contact elements do not become delaminated from the surrounding plastic during the further processing steps.

In accordance with again an additional mode of the invention, there is provided the step of carrying out the insulating layer application step by applying the patterned electrically insulating layer on the electrically conductive surface.

In accordance with still another mode of the invention, a closed insulating layer is applied and is, subsequently, patterned to form an electrically insulating layer by photoresist technology. During the patterning, by way of example, non-exposed areas of the photoresist are dissolved away and electrically conductive surface regions of the basic substrate are, thus, uncovered.

In accordance with still a further mode of the invention, the patterned electrically insulating layer is applied by a screenprinting method. In such a case, the screen advantageously acts as a patterning mask so that an insulating layer is produced only in the regions in which the screen is not masked.

In accordance with still an added mode of the invention, an initially closed insulating layer can be patterned on the basic substrate by sputtering technology through a mask. In such sputtering technology, highly accelerated directed ions are used to remove the closed insulating layer at the locations at which it is not protected by a mask. Such a method has the advantage that extremely fine structures with extremely rectilinear walls can be produced.

In accordance with still an additional mode of the invention, a closed insulating layer can be implemented on the basic substrate by vapor phase deposition. Gases used are organic substances that decompose at the surface of an electrically conductive layer and form an insulating film on the surface.

In accordance with another mode of the invention, an initially closed insulating layer can be patterned by plasma etching technology through a mask. In a similar manner to the sputtering technology, in this case, the underlying insulating layer is removed through the mask, but, during the plasma etching, chemical reactions accelerate the removal of the insulating layer down to the conductive surface of the basic substrate.

A technology for patterning closed insulating layers that manages with no mask at all is laser raster irradiation, during which the insulating layer is vaporized by a scanning laser beam, which draws the structures into the insulating layer, under the action of the laser energy.

Once a patterned insulating layer is present and at least the regions of the surface of the basic substrate at which external contact elements are intended to be disposed have been uncovered, a conductive material is, then, applied to the uncovered electrically conductive surface regions. In such a case, the material may include a single alloy throughout or it may also be applied layer by layer with a varying material sequence. For the production of the leadframe according to the invention, however, it is necessary that a conductive material is deposited and this conductive material grows beyond the patterned insulating layer. Only, thus, is it possible to produce the rivet-shaped cross-section according to the invention for the external contact elements.

A plurality and variety of methods are available for the application of a conductive material. In one implementation of the method, the application of a conductive material is carried out by electrodeposition on the uncovered electrically conductive surface regions until overgrowth of the deposited material at the uncovered locations to form a rivet head is achieved. However, the conductive material may also be effected by vapor phase deposition by a procedure in which, by way of example, an organometallic compound is decomposed over the basic substrate and the metal in the compound is deposited on the basic substrate in the uncovered electrically conductive surface regions.

In accordance with a further mode of the invention, the application of a conductive material is by currentless electrodeposition. A currentless electrodeposition has the advantage that an electrical voltage does not have to be applied to the leadframe. Rather, the leadframe is immersed in the deposition bath and withdrawn with a currentlessly deposited metal layer. During the stripping of the patterned insulating layer, the desired rivet-shaped cross-sections form in envisaged surface regions for the external contact elements.

At the same time as the external contact elements a metallic base may be formed in the chip carrier region of the lead frame. Such a metallic base has the advantage that, by way of example, the underside of the semiconductor chip can be contact-connected therewith. In principle, any desired geometrical structure that serves for the formation of external contact area configurations can be deposited on the basic substrate by the method according to the invention. After the application of the metallic material, the patterned electrically insulating layer is removed, which can be done wet-chemically by solvents or by dry incineration in a plasma.

Semiconductor chips that are potted on one side in a plastics compound to form an electronic device have the advantage of an extremely planar housing construction, but also the disadvantage that the external contact elements that are required for forwarding electrical signals and for supplying power to the semiconductor chip cannot be held with sufficient reliability by the plastics compound potted on one side. Thus, there is the risk of the electronic devices becoming unusable due to loosening or delamination of the external contact elements.

Such a problem is surmounted by an electronic device according to the invention. With the objects of the invention in view, there is also provided an electronic device, including external contact elements, at least one of the external contact elements having a rivet-shaped cross-section with a rivet head region, a rivet shank region, and a rivet foot region, a plastics compound, a semiconductor chip having contact areas connected to the external contact elements, the semiconductor chip being potted in the plastics compound as a housing, and the at least one external contact element being anchored with the rivet head region in the plastics compound.

Thus, the electronic device has a semiconductor chip whose contact areas are connected to external contact elements, the semiconductor chip with the external contact elements being potted in a plastics compound as housing and at least one external contact element having a rivet-shaped cross-section with a rivet head region a rivet shank region and a rivet foot region, the external contact element being anchored with its rivet head region in the plastics compound. In such a case, the plastics compound encloses the rivet head region such that the rivet shank is disposed in a manner completely fixed in the plastics compound.

In accordance with an added feature of the invention, the contact area of the external contact element is buffered by the rivet foot region, which is kept free of plastics compound so that its surface has an externally accessible contact area. The rivet foot region can be configured in various ways and is of circular plan in one embodiment. In another configuration of the invention, the external contact area is elongate and, thus, rectangular. In such a case, however, the cross-section remains unchanged as rivet-shaped. An elongate external contact element may, thus, have, in plan, a rectangular external contact area formed by the rivet foot, and additionally exhibit a rivet-shaped external contact area on account of the rivet-shaped cross-section in elevation.

In accordance with an additional feature of the invention, at least one external contact element has a longitudinal extent and a rivet-shaped cross-section forming an externally accessible rivet-shaped external contact area.

In such a case, in accordance with yet another feature of the invention, the rivet-shaped external contact area is disposed at right angles to the external contact area of the rivet foot region, in which case, in a further embodiment of the invention, the external contact areas of the electronic device are situated in the edge region of the housing made of plastics compound.

Circular plans of the rivet foot are provided as external contact areas if, in a further embodiment, the contact areas of the semiconductor chip have bonding bumps that are bonded directly onto the rivet head region of the external contact elements. Such rivet-shaped external contact elements with a circular plan were, therefore, disposed directly below the semiconductor chip so that they can be connected to the bonding bumps of the semiconductor chip. To that end, the semiconductor chip is oriented toward the external contact elements with its active side having a semiconductor circuit.

The semiconductor chip is oriented toward the external contact elements with its passive side having no semiconductor circuit, then, the passive side of the semiconductor chip can be kept free of plastics compound and, in part, form the underside of the housing. Such an embodiment of the invention has the advantage that extremely planar electronic devices can be realized. In this case, the contact areas of the semiconductor chip are connected to the head regions of the external contact elements through bonding wires.

With the objects of the invention in view, there is also provided a method for producing an electronic device, including the steps of providing a leadframe having a basic substrate and external contact elements having a rivet-shaped cross-section with a rivet head region, a rivet shank region, and a rivet foot region, the rivet foot region being fixed on the basic substrate, applying semiconductor chips to the leadframe, the semiconductor chips having contact areas, producing connections between the contact areas and the external contact elements, potting the leadframe having the applied semiconductor chips and the connections with a plastics compound to form electronic devices with a housing of the plastics compound, the external contact elements being anchored with the rivet head region in the plastics compound, and singulating the electronic devices produced on the leadframe.

Devices produced by the method have the advantages set forth in the following text.

The sidewalls of the grown rivet-shaped cross-sections are virtually perpendicular in the rivet shank region and taper only by 2–6 $\mu$m at a height of 30 $\mu$m. Overgrowth of the electrically insulating layer of the leadframe produces, on the leadframe, mushroom or rivet-forms that guarantee outstanding anchoring of the contact connection elements in the plastics compound. The external contact elements can be realized using a wide variety of materials and layer sequences. External contact elements made of pure silver or made of pure silver alloys or made of layer sequences of gold/nickel/gold or silver/copper/silver can be grown on the basic substrate of the leadframe. It is also possible to insert a separating layer between the basic layer and the external contact elements, e.g., a silver layer or a gold layer, thereby producing a very good etching stop if the basic substrate has to be resolved again by etching. However, the devices can also be separated from the basic substrate in a later method step through mechanical processes. A wet-chemical etching process may be obviated under certain circumstances.

In accordance with yet an added mode of the invention, the leadframe is advantageously potted, for a multiplicity of discrete electronic devices, with a plastics compound in uniform thickness in a large-area manner to form a plastic plate made of plastic film that has the basic substrate on one side. In particular, during potting, the leadframe is potted, for a multiplicity of discrete electronic devices, with a uniform thickness of the plastics compound substantially over an entire expanse of the leadframe to form a plastic plate having the basic substrate on one side of the plastic plate.

For a singulation to form electronic devices, the basic substrate is etched away from the plastic plate; in the case of an etching stop layer on the external contact elements, the etching stop layer protects the external contact elements against incipient etching and ends the etching operation. In accordance with yet a further mode of the invention, the etching away the basic substrate from the plastic plate is performed before carrying out the singulating step.

So that, during the singulation of the plastic plate to form discrete electronic devices with a plastic housing, the multiplicity of electronic devices do not become entangled, and remain ordered and oriented, the plastic plate may be coated with an adhesive film before singulation.

In accordance with yet an additional mode of the invention, sawing technology is used as the separating technology during the singulation. The singulating step is carried out by sawing the plastic plate to form discrete electronic devices.

In accordance with again another mode of the invention, the production of connections between contact areas on the semiconductor chip and external contact element is effected by flip-chip technology using bonding bumps bonded onto the rivet head regions of the external contact elements. This requires the external contact elements to be correspondingly disposed below the semiconductor chip opposite the contact areas of the semiconductor chip. The simultaneous bonding of all the bonding bumps is, then, readily possible on the rivet head regions of the external contact elements.

In accordance with again a further mode of the invention, the production of connections between contact areas of the semiconductor chip and the external contact elements is effected by bonding wire technology using bonding wires. To that end, the contact areas of the semiconductor chip are connected to the head region of the external contact elements through the bonding wires. During the subsequent potting with a plastics or synthetic resin compound, not only are the bonding wires enclosed in an outstanding manner by the plastics or synthetic resin compound, but the external contact element is also anchored securely in the plastics compound by virtue of its rivet-shaped cross-section. At the same time as the external contact elements, a metallic base can be deposited on the leadframe, onto which base the semiconductor chip can be soldered or adhesively bonded. This has the advantage, on one hand, that the semiconductor chip is supported by a metallic base, and the advantage, on the other hand, that the semiconductor underside has a large-area external contact by virtue of the metallic base.

The singulation of the electronic devices substantially depends on the material of the basic substrate that was used for producing the external contact elements. During the singulation of the electronic devices from a carbon-coated film that was used as basic substrate, the devices can be stripped away relatively simply, without requiring resolution of the film. The carbon layer residues merely have to be removed from the electronic device by a simple aftertreatment step, which, in one implementation of the method, can be effected by plasma incineration.

In accordance with again an added feature of the invention, the basic substrate is a carbon-coated film, and the film is stripped away from the electronic devices during the singulation of the electronic devices.

Another possibility during the singulation of the electronic devices from a metal-coated plastic film as basic substrate lies in the plastic film being stripped away and the metal coating remaining on the device being etched in wet-chemical or dry fashion. Only when the metal coating has been removed from the device are the external contact elements accessible.

In accordance with a concomitant feature of the invention, during the singulation of the electronic devices from a metallic foil as basic substrate, the metallic foil is removed completely by wet or dry etching, preferably, until an etching stop is reached between the material of the external contact elements and the metallic material of the basic substrate. As a result, after the removal of the metallic basic substrate, the devices are present in individual form, provided that they were not potted to form a plastic plate but rather are produced in individual cavities, and can be used directly without a further processing step.

Other features that are considered as characteristic for the invention are set forth in the appended claims.

Although the invention is illustrated and described herein as embodied in a leadframe for semiconductor chips and electronic devices and production methods for a leadframe and for electronic devices, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIGS. 1 to 5 are fragmentary, diagrammatic cross-sectional views of substantial production steps for a leadframe of a first embodiment of the invention;

DESCRIPTION OF THE PREFERRED EMBODIMENTS

Figure 4:
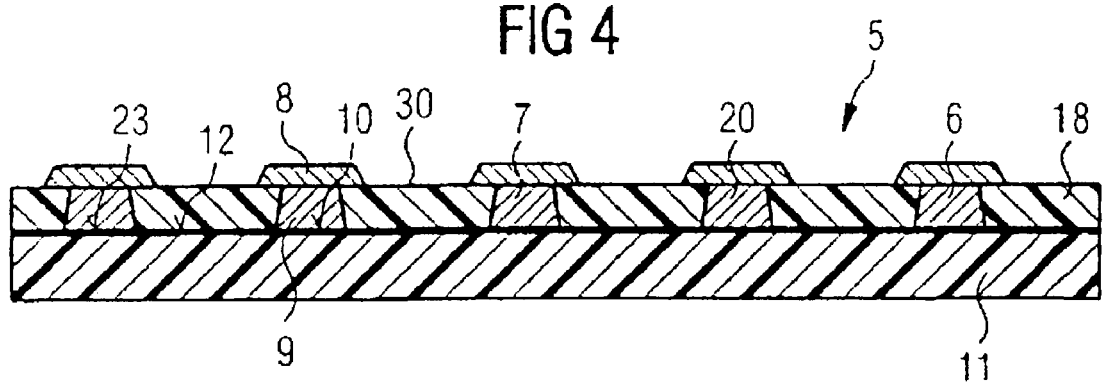

Referring now to the figures of the drawings in detail and first, particularly to FIG. 1 thereof, there is shown a diagrammatic cross-section through a basic substrate 11 of a leadframe 5 with an underside 28 and a top side 29, at least the top side 29 having an electrically conductive surface 12. The electrically conductive surface 12 may become electrically conductive by coating a plastic film or plastic plate with carbon.

As a further alternative, a metallic coated plastic plate or plastic film may be used as basic substrate 11 for a leadframe 5. As plastic, polyimide, polypropylene, or polyethylene may, advantageously, be used for a film, while synthetic resins are, preferably, used as plastic plates. In the embodiment of FIG. 1, the basic substrate is a metallic foil having an electrically conductive surface 12 both on the underside 28 and on the topside 29. The material of the metallic foil of FIG. 1 is a copper alloy having a thickness of between 50 $\mu$m and 200 μm. The basic substrate 11 imparts stability to the leadframe 5 and is not removed until after the completion of the electronic devices that are to be disposed and produced on the leadframe.

FIG. 2 is a diagrammatic cross-section through the basic substrate 11 of the leadframe 5 with a closed insulating layer 21. This insulating layer 21 may be a photoresist layer, which can be patterned photolithographically, or another plastic layer, which is patterned by plasma etching technology through a mask or by laser raster irradiation.

FIG. 3 shows a diagrammatic cross-section through the basic substrate 11 of the leadframe 5 of a first embodiment of the invention with a patterned electrically insulating layer 18, in which case, in this embodiment, the closed insulating layer 21 of FIG. 2 is a photoresist layer that was exposed with the aid of a non-illustrated photomask for pre-crosslinking of the photoresist in the regions having the patterned insulating layer 18 and remained unexposed for the regions that give rise to uncovered electrically conductive surface regions 19 during the development of the photoresist. In this first embodiment of the invention, the surface regions 19 are uncovered to apply at these locations external contact elements on the basic substrate 11 for a first embodiment of a leadframe.

FIG. 4 shows a diagrammatic cross-section through the basic substrate 11 with a patterned electrically insulating layer 18 applied on the electrically conductive surface 12 and external contact elements 6 made of electrically conductive material 20 that are applied on the uncovered electrically conductive surface regions 19. Overgrowth of the electrically conductive material 20 beyond the level 30 of the patterned electrically insulating layer 18 gives rise to a rivet-shaped cross-section for the electrically conductive material 20 on the uncovered electrically conductive surface regions 19. The rivet-shaped cross-section has a mushroom-head-shaped rivet head region 8, a pillar-shaped rivet shank region 9 and a rivet foot region 10 that is predetermined by the structure of the uncovered electrically conductive surface regions 19 of FIG. 3. The plan of the rivet foot region 10 may be circular or elongate or square, depending on the geometrical requirement made of the external contact element for the leadframe 5.

The electrically conductive material 20 can be applied to the uncovered electrically conductive surface regions 19 by electroplating or by electrodeposition between the patterned electrically insulating layer 18, this also being referred to as an electroforming method. During the electroforming method, by different electroplating baths, it is possible to realize different material layer sequences for the rivet foot region 10, the rivet shank region 9 and/or the rivet head region 8. Thus, in the rivet foot region 19, by way of example, a gold or silver layer may be deposited first to serve as an etching stop for the later separation of the leadframe 5 before a singulation into electronic devices. In such a case, the electrically conductive surface 12 of the basic substrate 11 or the entire basic substrate is produced from a baser metal than the rivet foot region 10 of the external contact elements 6. Other external contact elements have a layer sequence of gold in the foot region, nickel in the shank region and head region, and a final gold coating on the head region. However, the rivet shank region 9 can also be produced from the same material as the electrically conductive surface 12 and have, in the transition to the rivet foot region 10 of the external contact element, a nobler separating layer serving as an etching stop. In one exemplary embodiment, the basic substrate 11 is produced from a copper alloy and the rivet shank region 9 is, likewise, produced from a copper alloy and a silver layer is applied in between in the rivet foot region 10.

The application of electrically conductive material 20 for forming external contact elements 6 with a rivet-shaped cross-section 7 can also be effected by metal vapor phase deposition of organometallic compounds or by currentless deposition of metal ions from a liquid.

Figure 5:
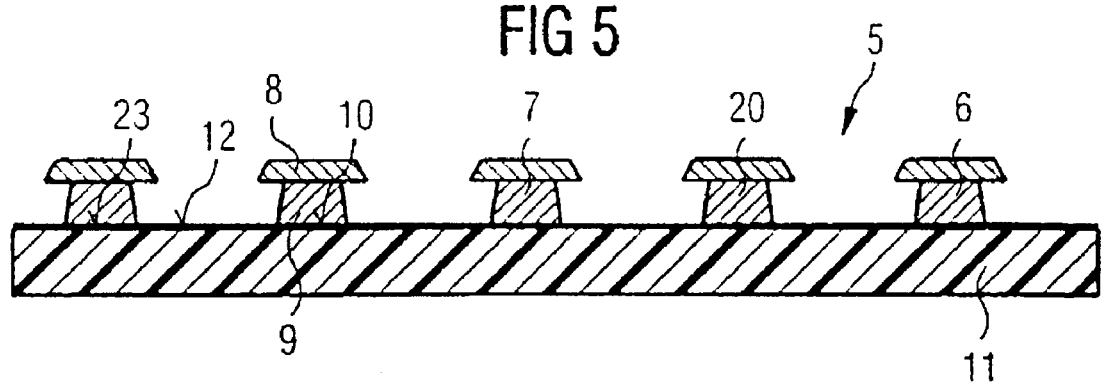

FIG. 5 shows a diagrammatic cross-section through a leadframe 5 of a first embodiment of the invention. The leadframe 5 has a basic substrate 11, on which are disposed external contact elements 6 exhibiting a rivet-shaped cross-section 7. The rivet-shaped cross-section includes a rivet foot region 10, a rivet shank region 9, and a rivet head region 8. The patterned electrically insulating layer 18 shown in FIG. 4 is removed in FIG. 5 so that FIG. 5 shows the diagrammatic cross-section through a partial region of a leadframe 5. In this first embodiment, the rivet foot region 10 has a circular plan and the series of external contact elements 6 shown in FIG. 5 can receive up a semiconductor chip with a correspondingly disposed series of contact areas and soldering balls or bonding bumps provided thereon, using flip-chip technology.

Figure 6:
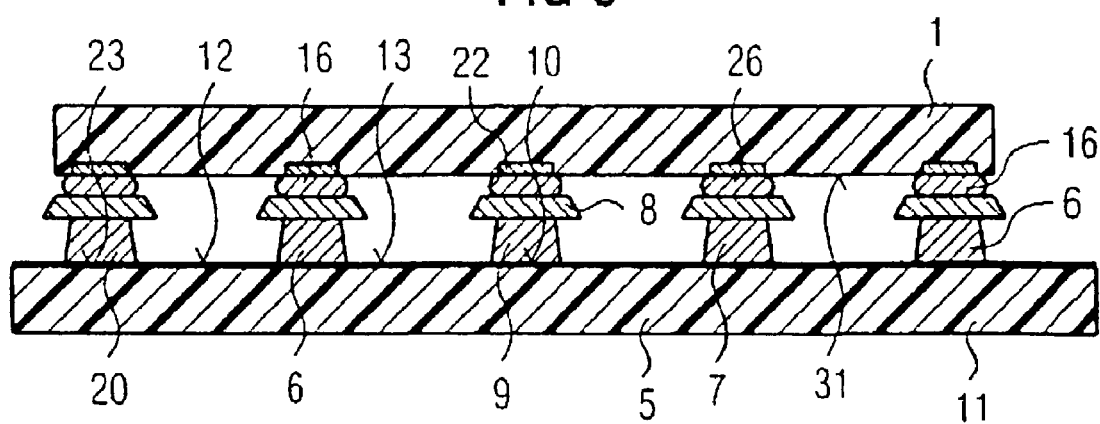
FIG. 6 is a fragmentary, diagrammatic, cross-sectional view through the leadframe of FIG. 5 with an applied semiconductor chip using flip-chip technology.

FIG. 6 shows a diagrammatic cross-section through the leadframe 5 of FIG. 5 with an applied semiconductor chip 1 using flip-chip technology. The semiconductor chip 1 is oriented toward the external contact elements 6 of the leadframe 5 with its active side 31, which has an electrical circuit, the bonding bumps 16, which are first disposed on the contact areas 22 of the semiconductor chip 1, being connected to the rivet head region 8 of the external contact elements 6 by soldering-on in FIG. 6. After the bonding bumps 16 have been soldered onto the rivet head regions 8 of the external contact elements 6, the leadframe 5 with applied semiconductor chip 1 can be potted by an injection-molding method under an injection mold on one side of a plastics compound or to form a plastic plate that uniformly encloses a multiplicity of semiconductor chips. In such a case, the closed basic substrate 11 delimits the injection-molding operation on one side, thereby enabling an unambiguous one-sided injection of the plastic housing without under-injection problems.

However, the electrically conductive surface 12 of the basic substrate 11 short-circuits the external contact elements 6 together and must, therefore, be removed from the electronic devices before or during the singulation thereof. In the case of carbon- or metal-coated plastic films, it is possible, firstly, to strip away the plastic film and, then, to oxidize and, thus, resolve the remaining carbon layer or to remove the remaining metal layer by dry or wet etching. In the case of wet etching, it is particularly advantageous if the rivet foot region 10 has an etching stop material.

If the basic substrate 11 is a metallic foil as in the exemplary embodiment of FIG. 6, then the metallic foil can be removed by wet or dry etching after the injection-molding of the plastic before or during the singulation of the electronic devices of a leadframe of the first embodiment. Here, too, it is advantageous if the external contact element 6 has an etching stop layer in the rivet foot region 10.

Figure 7:
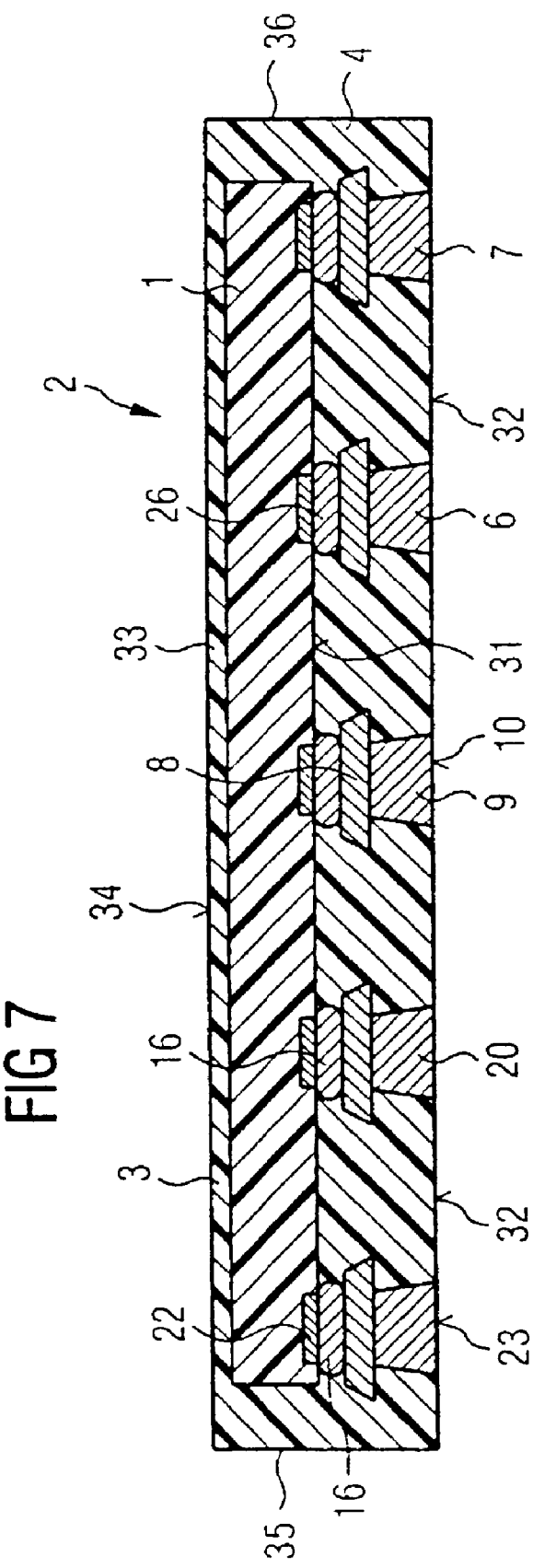
FIG. 7 is a fragmentary, diagrammatic, cross-sectional view through a first embodiment of an electronic device according to the invention.

FIG. 7 shows a diagrammatic cross-section through an electronic device 2 in accordance with a first embodiment of the invention. The electronic device 2 is provided with a housing 3 that is made of plastics compound 4 and is potted on one side, and has a semiconductor chip 1 in the housing 3, which semiconductor chip 1 has contact areas 22 connected to external contact elements 6 through bonding bumps 16 made of soldering balls, for example. The external contact elements 6 have a rivet-shaped cross-section with a rivet foot region 10, a rivet shank region 9, and a rivet head region 8, the rivet head region 8 in each case being connected to the bonding bump 16 of the semiconductor chip 1. The external contact elements 6 are securely anchored in the plastics compound 4 on account of their rivet-shaped cross-section because the rivet shank region 9 has a smaller extent than the rivet head region 8.

On the underside 32 of the component, the surface of the rivet foot region 10 is situated in a manner free from plastics compound 4 and is, thus, externally accessible as an external contact area for the insertion of the electronic device 2 into a circuit configuration. In this embodiment, the rivet foot region 10 has a circular plan, but may also have a longitudinal extent if an elongate contact area is required for the electronic device. The rivet foot region 10 can be refined with its external contact area 23, in order to protect the external contact area 23 against oxidation and erosion. To that end, the external contact area 23, preferably, has a gold or silver layer. Both materials are resistant to oxidation, in a free atmosphere the silver layer tending to form silver sulfite, which is electrically conductive, however, in contrast to an oxide layer of other materials.

With a refined external contact area 23, the external contact element 6 can be produced from a less noble copper or aluminum alloy in its rivet shank region 9 and, also, in its rivet head region 8, in which case, the rivet head region 8 can be coated with a solderable alloy. Such an electronic device of a first embodiment of the invention ensures that the external contact elements 6 are anchored extremely reliably in the plastic compound 4 of the housing 3. However, a relatively planar construction is achieved, which is suitable, in particular, for smart card applications.

Figure 8:
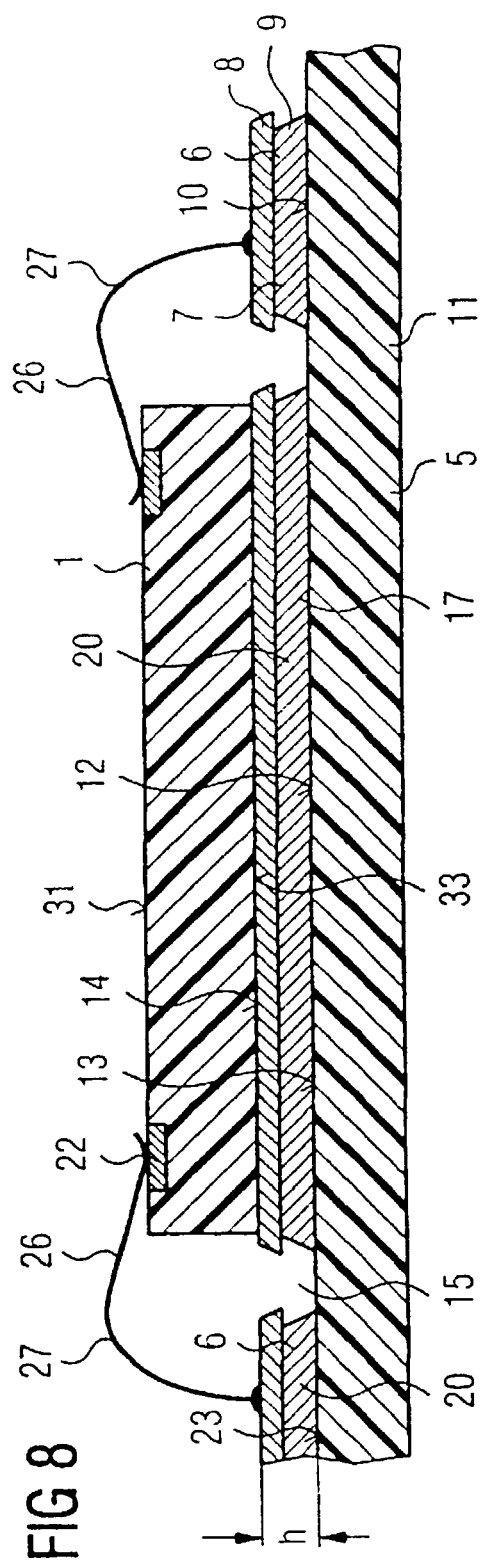
FIG. 8 is a fragmentary, diagrammatic, cross-sectional view through a second embodiment of the electronic device according to the invention having a leadframe with applied semiconductor chip.

FIG. 8 shows a diagrammatic cross-section through a leadframe 5 with an applied semiconductor chip 1 in accordance with a second embodiment of the invention. The leadframe 5 differs from the leadframe 5 of FIG. 5 in that a metallic base 17 is applied to the basic substrate 11 in the chip carrier region at the same time as the formation of external contact elements 6. In the embodiment of FIG. 8, the metallic base 17 is made of the same material as the external contact elements 6 and has the same height h. The areal extent of the metallic base 17 is adapted to the size of the semiconductor chip 1 so that the semiconductor chip 1 can be applied completely on the metallic base 17, as shown in FIG. 8. The application can be effected by adhesive bonding using a conductive adhesive or by alloying the semiconductor chip 1 onto the metallic base 17.

In the second embodiment of the leadframe 5, the semiconductor chips 1 are applied to the metallic base 17 with their passive side 33, which does not carry an electronic circuit. The active side 31 is freely accessible from above with its contact areas 22 so that the contact areas 22 of the semiconductor chip 1 can be connected to the external contact elements 6 through bonding wires 27 before a potting of the leadframe 5 with plastics compound 4 is performed on the leadframe 5. The leadframe 5 shown here in FIG. 8 is provided for a multiplicity of discrete components of the order of magnitude of 1.0×0.6 mm, with a device height of 0.4 mm, the leadframe 5 carrying more than 1000 components on an area of 50×50 mm. Therefore, in this embodiment of the invention, the plastics compound 4 is potted on the entire leadframe 5 to form a plastic plate. The basic substrate 11, which adheres on the plastic plate, is removed and the plastic plate is, subsequently, mounted onto an adhesive film and separated column-wise and row-wise into individual devices on the adhesive film so that individual components can be removed from the adhesive film.

Figure 9:
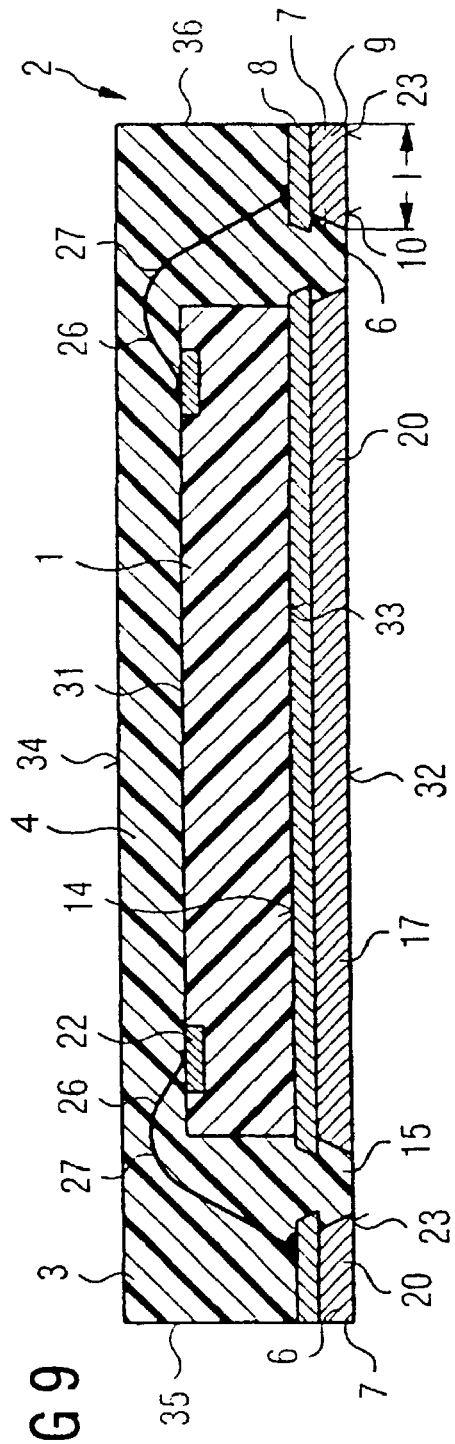
FIG. 9 is a fragmentary, diagrammatic, cross-sectional view of another embodiment of the electronic device of FIG. 8.

FIG. 9 shows a diagrammatic cross-section of an electronic device 2 in accordance with a second embodiment of the invention. The device according to FIG. 9 has been sawn from a plastic plate, which is shown with the aid of the leadframe 5 as in FIG. 8. The basic substrate 11, which can still be seen with the reference symbol in FIG. 8, has already been etched away or stripped away from the plastic plate so that the underside of the housing is formed by the metallic base 17 and the external contact elements 6 and plastic-filled interspaces. The top side 34 of the housing completely includes the plastics compound 4 and the sidewalls of the housing firstly include, in the lower region, cross-sectioned external contact elements so that they exhibit the rivet-shaped cross-section 7, the remaining region of the sidewalls 35 and 36 being formed by the plastics compound 4. The elongate plan of the external contact elements 6 results in a length l on the component underside 32 of the external contact area 23 after the separation of the plastic plate into individual devices, as shown in FIG. 9. In another non-illustrated embodiment of the invention, the external contact elements 6 are equipped with a circular plan and the sawing tracks in the plastic plate run entirely in plastic so that the external contact elements 6 are externally contact-connectable only with their rivet foot region 10, which is kept free of plastic on the underside 32 of the device 2.

Figure 10:
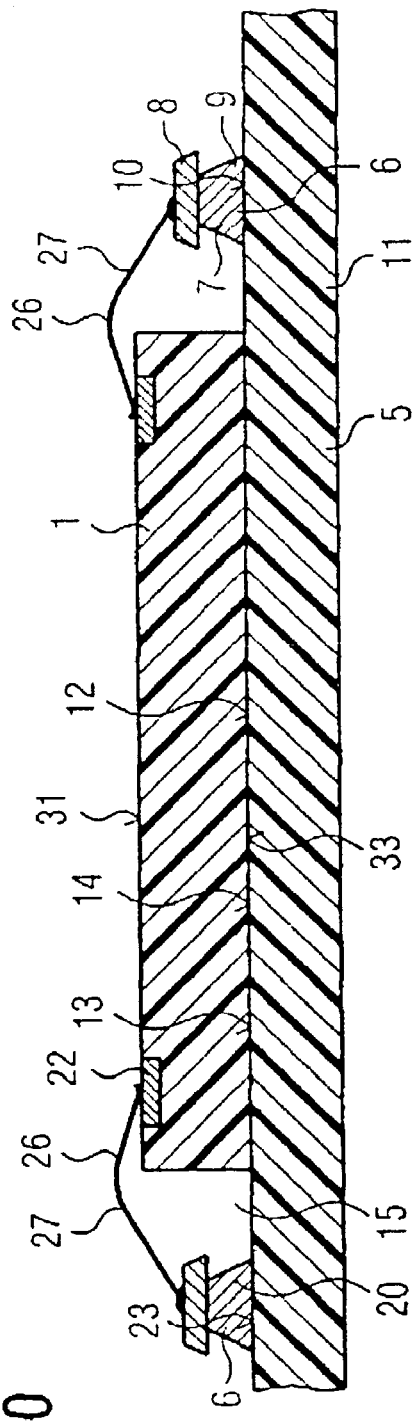
FIG. 10 is a fragmentary, diagrammatic, cross-sectional view through a third embodiment of the electronic device according to the invention having a leadframe with applied semiconductor chip.

FIG. 10 shows a diagrammatic cross-section through a leadframe 5 with an applied semiconductor chip 1 in accordance with a third embodiment of the invention. In the third embodiment of the invention, the semiconductor chip 1 is applied directly to the basic substrate 11 with its passive side 33. Furthermore, external contact elements 6 are disposed on the basic substrate 11 right around the semiconductor chip 1 and the rivet head regions 8 are connected to the contact areas 22 of the active side 31 of the semiconductor chip 1 through bonding wires 27. Such a leadframe 5 is connected with the aid of the housing-forming plastics compound 4 to form a plastic plate with attached basic substrate 11. The basic substrate 11, if it includes a metal foil, is etched away and the plastic plate is, subsequently, applied to an adhesive film and, then, separated into individual devices.

Figure 11:
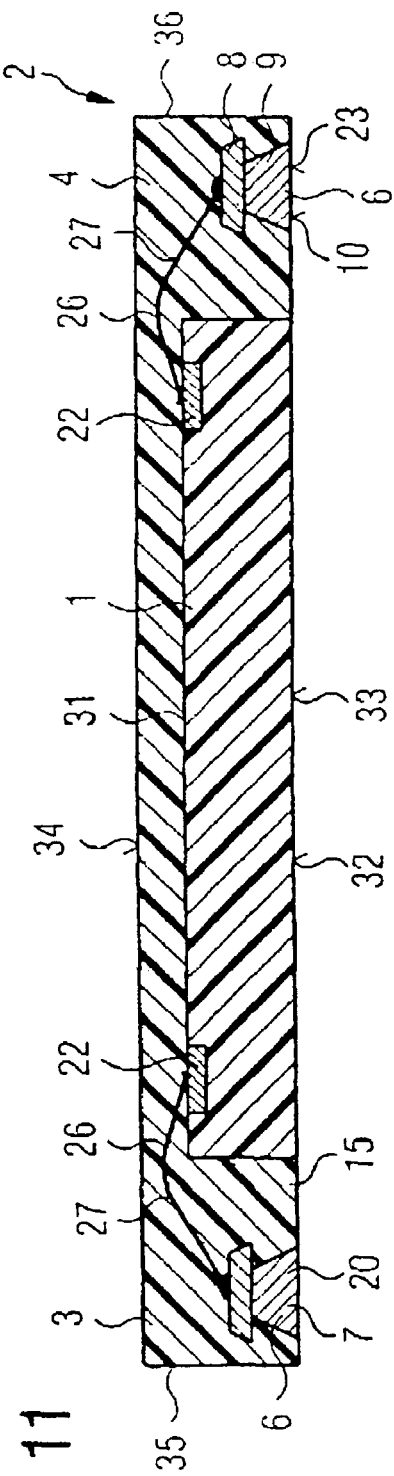
FIG. 11 is a fragmentary, diagrammatic, cross-sectional view of an alternative embodiment of the electronic device of FIG. 10.

FIG. 11 shows a diagrammatic cross-section through an electronic device in accordance with the third embodiment of the invention. This device is distinguished by its extreme planarity because even the base height h, as is shown in FIG. 8, is additionally obviated. A disadvantage of such a device is that the passive side 33 of the semiconductor chip 1 simultaneously forms the underside 32 of the electronic device. The semiconductor chip 1 is, thus, exposed to ambient influences with its underside 33. The external contact elements 6 are securely anchored in the plastics compound 4 of the housing 3 on account of their rivet-shaped cross-section and have, in their rivet foot region 10, a circular plan that provides a circular contact pad as external contact area 23.

I claim:

1. A leadframe for packaging semiconductor chips to form electronic devices in housings of a plastics compound, comprising:
   a basic substrate having a plurality of component mounting regions; and
   external contact elements having a rivet-shaped cross-section with a rivet head region, a rivet shank region, and a rivet foot region, said rivet foot region being fixed on said basic substrate, said rivet head region being connected to contact areas of the semiconductor chips by separated bonding bumps located over the rivet head regions;

each of said mounting regions having a chip carrier region with said external contact elements disposed at least partly in said chip carrier region such that a semiconductor chip is flip-chip bondable through said bonding bumps on said rivet head regions.

2. The leadframe according to claim 1, wherein said basic substrate has an electrically conductive surface.

3. The leadframe according to claim 1, wherein said basic substrate is of metallic foil.

4. The leadframe according to claim 1, wherein said basic substrate is of a plastic film with a metallic coating.

5. The leadframe according to claim 1, wherein said basic substrate is of a plastic film with a carbon coating.

6. The leadframe according to claim 1, wherein said chip carrier region is a central chip carrier region surrounded by said external contact elements at a defined distance from said central chip carrier region.

7. The leadframe according to claim 6, wherein said external contact elements have a circular plan and are completely disposed in said chip carrier region.

8. The leadframe according to claim 6, including a metallic base in said chip carrier region, said base having a height corresponding to said external contact elements and having an areal extent adapted to a size of a semiconductor chip.

9. The leadframe according to claim 8, wherein said external contact elements have a circular plan and are completely disposed in said chip carrier region.

10. The leadframe according to claim 1, wherein said external contact elements have a circular plan and are completely disposed in said chip carrier region.

11. The leadframe according to claim 1, wherein said external contact elements are of a material selected from one of the group consisting of pure silver and a silver alloy.

12. The leadframe according to claim 1, wherein said external contact elements are of a gold/nickel/gold layer sequence.

13. The leadframe according to claim 1, wherein said external contact elements are of a silver/copper/silver layer sequence.

14. A leadframe for packaging semiconductor chips to form electronic devices in housings of a plastics compound, comprising:
a basic substrate having a plurality of component mounting regions;
external contact elements having a rivet-shaped cross-section with a rivet head region, a rivet shank region, and a rivet foot region, said rivet foot region being fixed on said basic substrate, and said rivet head region being connected to contact areas of the semiconductor chips;
each of said mounting regions respectively having a central chip carrier region surrounded by said external contact elements at a defined distance from said central chip carrier region;
a metallic base in said chip carrier region, said base having a height corresponding to said external contact elements and having an areal extent adapted to a size of a semiconductor chip; and
said metallic base being of a same material as said external contact elements.

15. An electronic device, comprising;
external contact elements, at least one of said external contact elements having a rivet-shaped cross-section with a rivet head region, a rivet shank region, and a rivet foot region;
a plastics compound;
a semiconductor chip having contact areas connected to said rivet head region of said external contact elements, said semiconductor chip being potted in said plastics compound as a housing;
said at least one external contact element being anchored with said rivet head region in said plastics compound; and
said semiconductor chip having contact areas with bonding bumps bonded directly to said rivet head region.

16. The electronic device according to claim 15, wherein said rivet foot region is free of said plastics compound and has a surface with an externally accessible external contact area.

17. The electronic device according to claim 15, wherein said at least one external contact element has a longitudinal extent and a rivet-shaped cross-section forming an externally accessible rivet-shaped external contact area.

18. The electronic device according to claim 17, wherein:
said rivet foot region has an external contact area; and
said rivet-shaped external contact area is disposed at right angles to said external contact area.

19. The electronic device according to claim 18, wherein:
said housing has an edge region; and
said external contact area is disposed in said edge region.

20. The electronic device according to claim 17, wherein:
said housing has an edge region; and
said external contact area is disposed in said edge region.

21. The electronic device according to claim 15, wherein;
said semiconductor chip has a passive side with no semiconductor circuit; and said passive side is oriented towards said external contact elements.

22. The electronic device according to claim 21, wherein:
said housing has an underside; and
said passive side is free of plastics compound and is partly said underside of said housing.

23. The electronic device according to claim 22, including bonding wires connecting at least one of said contact areas to at least one of said rivet head regions.

24. The electronic device according to claim 21, including bonding wires connecting at least one of said contact areas to at least one of said rivet head regions.

25. An electronic device, comprising:
external contact elements, at least one of said external contact elements having a rivet-shaped cross-section with a rivet head region, a rivet shank region, and a rivet foot region;
a plastics compound;
a semiconductor chip having contact areas connected to said rivet head region of said external contact elements by a separate bonding bump, said semiconductor chip being potted in said plastics compound as a housing;
said at least one external contact element being anchored with said rivet head region in said plastics compound;
said semiconductor chip having an active side with a semiconductor circuit; and
said active side being oriented toward said external contact elements.

26. A method for producing a leadframe for packaging semiconductor chips to form electronic devices in housings of a plastics compound, which comprises;
providing a basic substrate with an electrically conductive surface;
applying on the basic substrate a patterned electrically insulating layer having uncovered electrically conductive surface regions in a contact element configuration having a plurality of component mounting regions;

applying a conductive material to form external contact elements in the contact element configuration, the external contact elements having a rivet-shaped cross-section with a rivet head region, a rivet shank region, and a rivet foot region, the rivet foot region being fixed on the basic substrate, the rivet head region to be connected to contact areas of the semiconductor chips, the rivet head regions having separate bonding bumps;

forming a chip carrier region in each of the mounting regions and placing the external contact elements at least partly in the chip carrier region such that a semiconductor chip is flip-chip bondable through the bonding bumps on the rivet head regions; and removing the patterned electrically insulating layer.

27. The method according to claim 26, which further comprises carrying out the insulating layer application step by applying the patterned electrically insulating layer on the electrically conductive surface.

28. The method according to claim 26, which further comprises carrying out the insulating layer application step by first applying a closed insulating layer and then patterning the closed insulating layer by photoresist technology to form the patterned electrically insulating layer.

29. The method according to claim 26, which further comprises carrying out the insulating layer application step by applying the patterned electrically insulating layer by a screenprinting process.

30. The method according to claim 26, which further comprises applying a patterned electrically conductive layer by a screenprinting process.

31. The method according to claim 26, which further comprises carrying out the insulating layer application step by sputtering a patterning of an initially closed insulating layer onto the basic substrate through a mask.

32. The method according to claim 26, which further comprises carrying out the insulating layer application step by vapor phase depositing an initially closed insulating layer to the basic substrate.

33. The method according to claim 26, which further comprises carrying out the insulating layer application step by plasma etching a patterning of an initially closed insulating layer through a mask.

34. The method according to claim 26, which further comprises carrying out the insulating layer application step by laser raster irradiating a patterning of an initially closed insulating layer.

35. The method according to claim 26, which further comprises carrying out the conductive material application step by electrodepositing the conductive material on the uncovered electrically conductive surface regions until overgrowth of the deposited material forms a rivet head.

36. The method according to claim 26, which further comprises carrying out the conductive material application step by vapor phase depositing a metal.

37. The method according to claim 26, which further comprises carrying out the conductive material application step by currentlessly electrodepositing the conductive material.

38. The method according to claim 26, which further comprises forming a metallic base in a chip carrier region of the basic substrate at the same time the external contact elements are formed.

39. A method for producing an electronic device, which comprises:
providing a leadframe having:
a basic substrate having a plurality of component mounting regions; and
external contact elements having a rivet-shaped cross-section with a rivet head region, a rivet shank region, and a rivet foot region, the rivet foot region being fixed on the basic substrate, separate bonding bumps on the rivet head regions;
each of the mounting regions having a chip carrier region with the external contact elements disposed at least partly in the chip carrier region such that a semiconductor chip is flip-chip bondable through the bonding bumps on the rivet head regions;
applying semiconductor chips to the leadframe, the semiconductor chips having contact areas;
producing connections between the contact areas and the rivet head region of the external contact elements;
potting the leadframe having the applied semiconductor chips and the connections with a plastics compound to form electronic devices with a housing of the plastics compound, the external contact elements being anchored with the rivet head region in the plastics compound; and
singulating the electronic devices produced on the leadframe.

40. The method according to claim 39, which further comprises, during potting, potting the leadframe, for a multiplicity of discrete electronic devices, with a uniform thickness of the plastics compound substantially over an entire expanse of the leadframe to form a plastic plate having the basic substrate on one side of the plastic plate.

41. The method according to claim 40, which further comprises, etching away the basic substrate from the plastic plate before carrying out the singulating step.

42. The method according to claim 41, which further comprises coating the plastic plate with an adhesive film before singulation.

43. The method according to claim 40, which further comprises coating the plastic plate with an adhesive film before singulation.

44. The method according to claim 40, which further comprises carrying out the singulating step by sawing the plastic plate to form discrete electronic devices.

45. The method according to claim 39, which further comprises producing the connections between the contact areas and the external contact elements by bonding bumps onto the rivet head regions of the external contact elements and flip-chip mounting the leadframe and the semiconductor chips through the bumps.

46. The method according to claim 39, which further comprises producing the connections between the contact areas and the external contact elements by flip-chip technology utilizing bonding bumps bonded onto the rivet head regions of the external contact elements.

47. The method according to claim 39, which further comprises producing the connections between contact areas of the semiconductor chip and the external contact elements by connecting the contact areas of the semiconductor chip to the rivet head regions of the external contact elements with bonding wires.

48. The method according to claim 39, which further comprises one of soldering and adhesively bonding the semiconductor chips onto a metallic base during application of semiconductor chips to the leadframe.

49. The method according to claim 39, wherein the basic substrate is a carbon-coated film, and which further comprises stripping the film away from the electronic devices during the singulation of the electronic devices.

50. The method according to claim 49, which further comprises removing a carbon layer from the electronic devices by plasma incineration after stripping away the film.

51. The method according to claim 39, wherein the basic substrate is a metal-coated plastic film and which further comprises, during the singulation of the electronic devices:
stripping away the plastic film of the metal-coated plastic film; and removing the metallic coating of the metal-coated plastic film by one of wet-chemical etching and dry etching.

52. The method according to claim 39, wherein the basic substrate is a metallic foil and which further comprises, during the singulation of the electronic devices, completely removing the metallic foil by one of wet etching and dry etching until an etching stop is reached between the material of the external contact elements and the metallic material of the basic substrate.

* * * * *